(12) United States Patent
Tang et al.

(10) Patent No.: US 9,995,821 B2
(45) Date of Patent: Jun. 12, 2018

(54) ACTIVE BEAM-FORMING TECHNIQUE FOR PIEZOELECTRIC ULTRASONIC TRANSDUCER ARRAY

(71) Applicant: QUALCOMM Incorporated, San Diego, CA (US)

(72) Inventors: Hao-Yen Tang, Berkeley, CA (US); Yipeng Lu, Davis, CA (US); Hrishikesh Vijaykumar Panchawagh, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 95 days.

(21) Appl. No.: 14/883,585

(22) Filed: Oct. 14, 2015

(65) Prior Publication Data

US 2016/0131747 A1  May 12, 2016

Related U.S. Application Data

(60) Provisional application No. 62/064,416, filed on Oct. 15, 2014, provisional application No. 62/064,417, (Continued)

(51) Int. Cl.
*G01S 7/52* (2006.01)
*B06B 1/06* (2006.01)
(Continued)

(52) U.S. Cl.
CPC .......... *G01S 7/5208* (2013.01); *B06B 1/0207* (2013.01); *B06B 1/0607* (2013.01);
(Continued)

(58) Field of Classification Search
None
See application file for complete search history.

(56) References Cited

U.S. PATENT DOCUMENTS

| 3,800,270 A | 3/1974 | Bailey |
| 4,307,613 A | 12/1981 | Fox |

(Continued)

FOREIGN PATENT DOCUMENTS

| DE | 3940808 A1 | 6/1991 |
| GB | 2511556 A | 9/2014 |

(Continued)

OTHER PUBLICATIONS

International Preliminary Report on Patentability—PCT/US2015/055825—ISA/EPO—dated Feb. 3, 2017.
(Continued)

*Primary Examiner* — Hovhannes Baghdasaryan
(74) *Attorney, Agent, or Firm* — Weaver Austin Villeneuve & Sampson LLP—Qual

(57) ABSTRACT

An apparatus includes an array of pixels, each pixel including in-cell pixel logic and a piezoelectric micromechanical ultrasonic transducer (PMUT) element, each in-cell pixel logic being communicatively coupled with at least one adjacent pixel in the array. Transceiver electronics may operate the array in a selectable one of a first mode and a second mode. In the first mode, the array may generate a substantially plane ultrasonic wave. In the second mode, the array may generate, from at least one superpixel region, a focused beam of relatively high acoustic pressure, each superpixel region including at least one inner pixel disposed in a central portion of the superpixel region and at least a first group of outer pixels disposed in an outer portion of the superpixel region. The transceiver electronics may be configured to operate the array by configuring at least one in-cell pixel logic.

26 Claims, 11 Drawing Sheets

Related U.S. Application Data filed on Oct. 15, 2014, provisional application No. 62/064,418, filed on Oct. 15, 2014.

(51) Int. Cl.

| | | |
|---|---|---|
| *H01L 41/047* | (2006.01) | |
| *G10K 11/34* | (2006.01) | |
| *G06F 3/041* | (2006.01) | |
| *G06F 3/043* | (2006.01) | |
| *G06K 9/00* | (2006.01) | |
| *G10K 11/26* | (2006.01) | |
| *G01S 7/521* | (2006.01) | |
| *G01S 15/04* | (2006.01) | |
| *G01S 15/89* | (2006.01) | |
| *H01L 41/08* | (2006.01) | |
| *B06B 1/02* | (2006.01) | |

(52) U.S. Cl.
CPC .......... *B06B 1/0644* (2013.01); *B06B 1/0666* (2013.01); *G01S 7/521* (2013.01); *G01S 15/04* (2013.01); *G01S 15/89* (2013.01); *G01S 15/8915* (2013.01); *G06F 3/0412* (2013.01); *G06F 3/0416* (2013.01); *G06F 3/0436* (2013.01); *G06K 9/0002* (2013.01); *G06K 9/00335* (2013.01); *G10K 11/26* (2013.01); *G10K 11/34* (2013.01); *G10K 11/346* (2013.01); *H01L 41/047* (2013.01); *H01L 41/08* (2013.01); *B06B 2201/20* (2013.01); *B06B 2201/55* (2013.01); *G06F 2203/04101* (2013.01); *G10K 11/341* (2013.01)

(56) References Cited

U.S. PATENT DOCUMENTS

| | | | |
|---|---|---|---|
| 4,523,471 A | 6/1985 | Lee | |
| 5,744,898 A | 4/1998 | Smith et al. | |
| 6,383,141 B1 | 5/2002 | Itoi | |
| 6,736,779 B1 | 5/2004 | Sano et al. | |
| 8,203,912 B2 | 6/2012 | Roest et al. | |
| 8,760,971 B2 | 6/2014 | Karl | |
| 8,958,610 B2 | 2/2015 | McNulty | |
| 2004/0267134 A1 | 12/2004 | Hossack et al. | |
| 2005/0023937 A1 | 2/2005 | Sashida et al. | |
| 2005/0041498 A1* | 2/2005 | Resta ................. | G11C 13/0004 365/203 |
| 2005/0057284 A1* | 3/2005 | Wodnicki ................. | A61B 8/13 327/100 |
| 2005/0075572 A1 | 4/2005 | Mills et al. | |
| 2005/0146247 A1 | 7/2005 | Fisher et al. | |
| 2005/0219212 A1* | 10/2005 | Koll ......................... | G09G 3/02 345/158 |
| 2006/0164919 A1 | 7/2006 | Watanabe et al. | |
| 2008/0110266 A1 | 5/2008 | Randall et al. | |
| 2008/0122317 A1 | 5/2008 | Fazzio et al. | |
| 2008/0258580 A1 | 10/2008 | Schneider et al. | |
| 2008/0309200 A1 | 12/2008 | Melandso et al. | |
| 2009/0204001 A1 | 8/2009 | Ona et al. | |
| 2010/0106431 A1 | 4/2010 | Baba et al. | |
| 2010/0168583 A1 | 7/2010 | Dausch et al. | |
| 2011/0215150 A1 | 9/2011 | Schneider et al. | |
| 2012/0188849 A1 | 7/2012 | Matsuda et al. | |
| 2012/0206014 A1 | 8/2012 | Bibl et al. | |
| 2012/0245408 A1 | 9/2012 | Shen et al. | |
| 2013/0134838 A1 | 5/2013 | Yun et al. | |
| 2013/0258805 A1* | 10/2013 | Hansen ................. | A61B 8/14 367/8 |
| 2013/0286778 A1* | 10/2013 | Kisner ................. | G01N 29/00 367/35 |
| 2013/0293065 A1 | 11/2013 | Hajati et al. | |
| 2014/0219521 A1 | 8/2014 | Schmitt et al. | |
| 2014/0232241 A1 | 8/2014 | Hajati | |
| 2014/0243676 A1* | 8/2014 | Cogan ................. | A61B 8/4444 600/459 |
| 2014/0354608 A1 | 12/2014 | Kitchens, II et al. | |
| 2015/0020608 A1 | 1/2015 | Chevrier et al. | |
| 2015/0087991 A1 | 3/2015 | Chen et al. | |
| 2015/0165479 A1 | 6/2015 | Lasiter et al. | |
| 2015/0169136 A1 | 6/2015 | Ganti et al. | |
| 2015/0198699 A1 | 7/2015 | Kuo et al. | |
| 2015/0346903 A1* | 12/2015 | O'Connor .............. | G09G 5/003 345/173 |
| 2015/0357375 A1 | 12/2015 | Tsai et al. | |
| 2016/0107194 A1 | 4/2016 | Panchawagh et al. | |
| 2016/0132187 A1 | 5/2016 | Lu et al. | |
| 2017/0110504 A1 | 4/2017 | Panchawagh et al. | |

FOREIGN PATENT DOCUMENTS

| | | |
|---|---|---|
| JP | 2013135793 A1 | 7/2013 |
| WO | 2014108960 A1 | 7/2014 |
| WO | 2015086413 A1 | 6/2015 |
| WO | 2016061406 A1 | 4/2016 |
| WO | 2016061410 A1 | 4/2016 |
| WO | 2016061412 A1 | 4/2016 |
| WO | PCT/US16/57104 | 10/2016 |
| WO | WO 2017066612 A1 | 4/2017 |

OTHER PUBLICATIONS

International Preliminary Report on Patentability—PCT/US2015/055827—ISA/EPO—dated Feb. 3, 2017.
International Preliminary Report on Patentability—PCT/US2015/055821—ISA/EPO—dated Feb. 3, 2017.
International Search Report and Written Opinion—PCT/US2016/57104—ISA/EPO—dated Jan. 23, 2017.
U.S. Office Action dated May 3, 2017, issued in U.S. Appl. No. 14/883,586.
U.S. Appl. No. 15/292,057, filed Oct. 12, 2016, Panchawagh; Hrishikesh Vijaykumar et al.
International Search Report and Written Opinion—PCT/US2015/055825—ISA/EPO—dated Feb. 8, 2016.
Second Written Opinion of the International Preliminary Examining Authority—PCT/US2015/055825—ISA/EPO—dated Sep. 26, 2016.
International Search Report and Written Opinion—PCT/US2015/055827—ISA/EPO—dated Feb. 4, 2016.
Second Written Opinion of the International Preliminary Examining Authority—PCT/US2015/055827—ISA/EPO—dated Sep. 26, 2016.
International Search Report and Written Opinion—PCT/US2015/055821—ISA/EPO—dated Feb. 4, 2016.
Second Written Opinion of the International Preliminary Examining Authority—PCT/US2015/055821—ISA/EPO—dated Sep. 26, 2016.
U.S. Final Office Action dated Oct. 18, 2017, issued in U.S. Appl. No. 14/883,586.
U.S. Office Action dated Jan. 3, 2018 issued in U.S. Appl. No. 14/883,586.

\* cited by examiner

ACTIVE BEAM-FORMING TECHNIQUE FOR PIEZOELECTRIC ULTRASONIC TRANSDUCER ARRAY

CROSS-REFERENCE TO RELATED APPLICATIONS

This disclosure claims priority to U.S. Provisional Patent Application No. 62/064,416, filed on Oct. 15, 2014, entitled "THREE-PORT PIEZOELECTRIC ULTRASONIC TRANSDUCER," to Provisional Patent Application No. 62/064,417, filed on Oct. 15, 2014 and entitled "ACTIVE BEAM-FORMING TECHNIQUE FOR PIEZOELECTRIC ULTRASONIC TRANSDUCER ARRAY," to Provisional Patent Application No. 62/064,418, filed on Oct. 15, 2014 and entitled "SUPERPIXEL ARRAY OF PIEZOELECTRIC ULTRASONIC TRANSDUCERS FOR 2-D BEAMFORMING," which are hereby incorporated by reference. Provisional Patent Application No. 62/241,651, filed on Oct. 14, 2015 and entitled "INTEGRATED PIEZOELECTRIC MICROMECHANICAL ULTRASONIC TRANSDUCER PIXEL AND READOUT," is hereby incorporated by reference.

TECHNICAL FIELD

This disclosure relates to an array of piezoelectric ultrasonic transducers for imaging and liveness determination, and more particularly to techniques for active beam-forming of portions of the array as superpixels for 2-D beamforming.

DESCRIPTION OF THE RELATED TECHNOLOGY

Thin film piezoelectric acoustic transducers are attractive candidates for numerous applications including biometric sensors such as fingerprint sensors, gesture detection, microphones and speakers, ultrasonic imaging, and chemical sensors. Such transducers may include piezoelectric micromechanical ultrasonic transducers (PMUTs) configured as a multilayer stack that includes a piezoelectric layer stack and a mechanical layer disposed over a cavity. The piezoelectric layer stack may include a layer of piezoelectric material. On or proximate to each of an upper and a lower surface of the piezoelectric layer, a respective upper and lower electrode layer may be disposed. The electrode layers may be patterned or unpatterned.

The assignee of the present disclosure has developed biometric sensors that include an array of PMUTs, each PMUT in the array corresponding to an individual pixel of a rendered image of, for example, a fingerprint. Normally, the PMUTs may be actuated approximately simultaneously, a technique that may be referred to as plane wave excitation. FIG. 1A illustrates an example of plane wave excitation in which each PMUT in an array 100 emits ultrasonic energy with substantially the same timing and phase of ultrasonic emissions originating from neighboring PMUTs. As illustrated in Detail A, the aggregate ultrasonic signal approximates a plane wave. The acoustic pressure for such a plane wave is fairly uniform with respect to position across the PMUT array (Detail B).

A pixel array operating in a plane wave excitation and transmission mode has been shown to produce sufficient average acoustic pressure to provide a fingerprint image resolution on the order of 500 dpi (dots per inch).

SUMMARY

The systems, methods and devices of this disclosure each have several innovative aspects, no single one of which is solely responsible for the desirable attributes disclosed herein.

One innovative aspect of the subject matter described in this disclosure relates to an apparatus that includes transceiver electronics and an array of pixels, each pixel including in-cell pixel logic and a piezoelectric micromechanical ultrasonic transducer (PMUT) element, each in-cell pixel logic being communicatively coupled with at least one adjacent pixel in the array, the transceiver electronics being communicatively coupled with the array and configured to operate the array in a selectable one of a first mode and a second mode. In the first mode, the array generates a substantially plane ultrasonic wave having a first acoustic pressure. In the second mode, the array generates, from at least one superpixel region, a focused beam having a second acoustic pressure that is substantially higher than the first acoustic pressure, each superpixel region including at least one inner pixel disposed in a central portion of the superpixel region and at least a first group of outer pixels disposed in an outer portion of the superpixel region. The transceiver electronics is configured to operate the array by configuring at least one in-cell pixel logic.

In some examples, the PMUT element may be disposed on a substrate, the substrate including thin-film transistor (TFT) circuitry. In some examples, the TFT circuitry may be co-fabricated with the PMUT element. In some examples, the TFT circuitry may include the in-cell pixel logic.

In some examples, configuring the at least one in-cell pixel logic may include, in the second mode, using a serial interface structure to clock in configuration information to each pixel and associate each pixel with a corresponding superpixel. In some examples, configuring the at least one in-cell pixel logic may include, in the second mode, designating each pixel as a center pixel or an outer pixel of the corresponding superpixel.

In some examples, the in-cell pixel logic includes a 2-bit memory, a 2-bit decoder, and a 2-bit shift register.

In some examples, the transceiver electronics may include at least one decoder configured to address and configure the in-cell pixel logic. In some examples, the at least one decoder may be configured to selectably designate each pixel as an inner pixel or an outer pixel of a corresponding superpixel. In some examples, the at least one decoder may be configured to selectably designate at least one pixel as an inner pixel. In some examples, each of the designated inner pixel and at least a second pixel adjacent to the designated inner pixel may include cell input interface logic and cell output interface logic; and the cell output interface logic of the designated inner pixel may be configured to send a wake-up signal to the cell input interface logic of the second pixel. In some examples, the cell input interface logic may be a seven input OR-gate configured to receive inputs from the decoder and from one or more adjacent pixels.

According to some implementations, a non-transitory computer readable medium has software stored thereon, the software includes instructions for causing an apparatus to: operate an array of pixels, each pixel including in-cell pixel logic and a piezoelectric micromechanical ultrasonic transducer (PMUT) element, in a selectable one of a first mode and a second mode, each in-cell pixel logic being communicatively coupled with at least one adjacent pixel in the array. A transceiver electronics is configured to operate the array by configuring at least one in-cell pixel logic. In the first mode, operating the array generates a substantially plane ultrasonic wave having a first acoustic pressure. In the second mode, operating the array generates, from at least one superpixel region, a focused beam having a second acoustic pressure that is substantially higher than the first acoustic pressure, each superpixel region including at least one inner pixel disposed in a central portion of the superpixel region and at least a first group of outer pixels disposed in an outer portion of the superpixel region.

In some examples, configuring the at least one in-cell pixel logic may include, in the second mode, using a serial interface structure to clock in configuration information to each pixel and associate each pixel with a corresponding superpixel. In some examples, configuring the at least one in-cell pixel logic may include, in the second mode, designating each pixel as a center pixel or an outer pixel of the corresponding superpixel.

In some examples, the transceiver electronics may include at least one decoder configured to address and configure the in-cell pixel logic. In some examples, the at least one decoder may be configured to selectably designate each pixel as an inner pixel or an outer pixel of a corresponding superpixel. In some examples, the at least one decoder may be configured to selectably designate at least one pixel as an inner pixel. Each of the designated inner pixel and at least a second pixel adjacent to the designated inner pixel may include cell input interface logic and cell output interface logic. The cell output interface logic of the designated inner pixel may be configured to send a wake-up signal to the cell input interface logic of at least the second pixel.

According to some implementations, a method includes operating an array of pixels, each pixel including in-cell pixel logic and a piezoelectric micromechanical ultrasonic transducer (PMUT) element, in a selectable one of a first mode and a second mode, each in-cell pixel logic being communicatively coupled with at least one adjacent pixel in the array. A transceiver electronics is configured to operate the array by configuring at least one in-cell pixel logic. In the first mode, operating the array generates a substantially plane ultrasonic wave having a first acoustic pressure. In the second mode, operating the array generates, from at least one superpixel region, a focused beam having a second acoustic pressure that is substantially higher than the first acoustic pressure, each superpixel region including at least one inner pixel disposed in a central portion of the superpixel region and at least a first group of outer pixels disposed in an outer portion of the superpixel region.

In some examples, the PMUT element may be disposed on a substrate, the substrate including thin-film transistor (TFT) circuitry co-fabricated with the PMUT element, the TFT circuitry including the in-cell pixel logic. In some examples, configuring the at least one in-cell pixel logic may include, in the second mode, using a serial interface structure to clock in configuration information to each pixel and associate each pixel with a corresponding superpixel. In some examples, configuring the at least one in-cell pixel logic may include, in the second mode, designating each pixel as a center pixel or an outer pixel of the corresponding superpixel. In some examples, the transceiver electronics may include at least one decoder configured to address and configure the in-cell pixel logic. In some examples, the at least one decoder is configured to selectably designate each pixel as an inner pixel or an outer pixel of a corresponding superpixel. In some examples, the at least one decoder may be configured to selectably designate at least one pixel as an inner pixel; each of the designated inner pixel and at least a second pixel adjacent to the designated inner pixel may include cell input interface logic and cell output interface logic; and the cell output interface logic of the designated inner pixel may be configured to send a wake-up signal to the cell input interface logic of at least the second pixel.

According to some implementations, an apparatus includes an array of pixels, each pixel including in-cell pixel logic and a piezoelectric micromechanical ultrasonic transducer (PMUT) element, each in-cell pixel logic being communicatively coupled with at least one adjacent pixel in the array; and means for operating the array in a selectable one of a first mode and a second mode by configuring at least one in-cell pixel logic. In the first mode, the array generates a substantially plane ultrasonic wave having a first acoustic pressure. In the second mode, the array generates, from at least one superpixel region, a focused beam having a second acoustic pressure that is substantially higher than the first acoustic pressure, each superpixel region including at least one inner pixel disposed in a central portion of the superpixel region and at least a first group of outer pixels disposed in an outer portion of the superpixel region.

BRIEF DESCRIPTION OF THE DRAWINGS

Details of one or more implementations of the subject matter described in this specification are set forth in this disclosure and the accompanying drawings. Other features, aspects, and advantages will become apparent from a review of the disclosure. Note that the relative dimensions of the drawings and other diagrams of this disclosure may not be drawn to scale. The sizes, thicknesses, arrangements, materials, etc., shown and described in this disclosure are made only by way of example and should not be construed as limiting. Like reference numbers and designations in the various drawings indicate like elements.

DETAILED DESCRIPTION

Figure 1A:
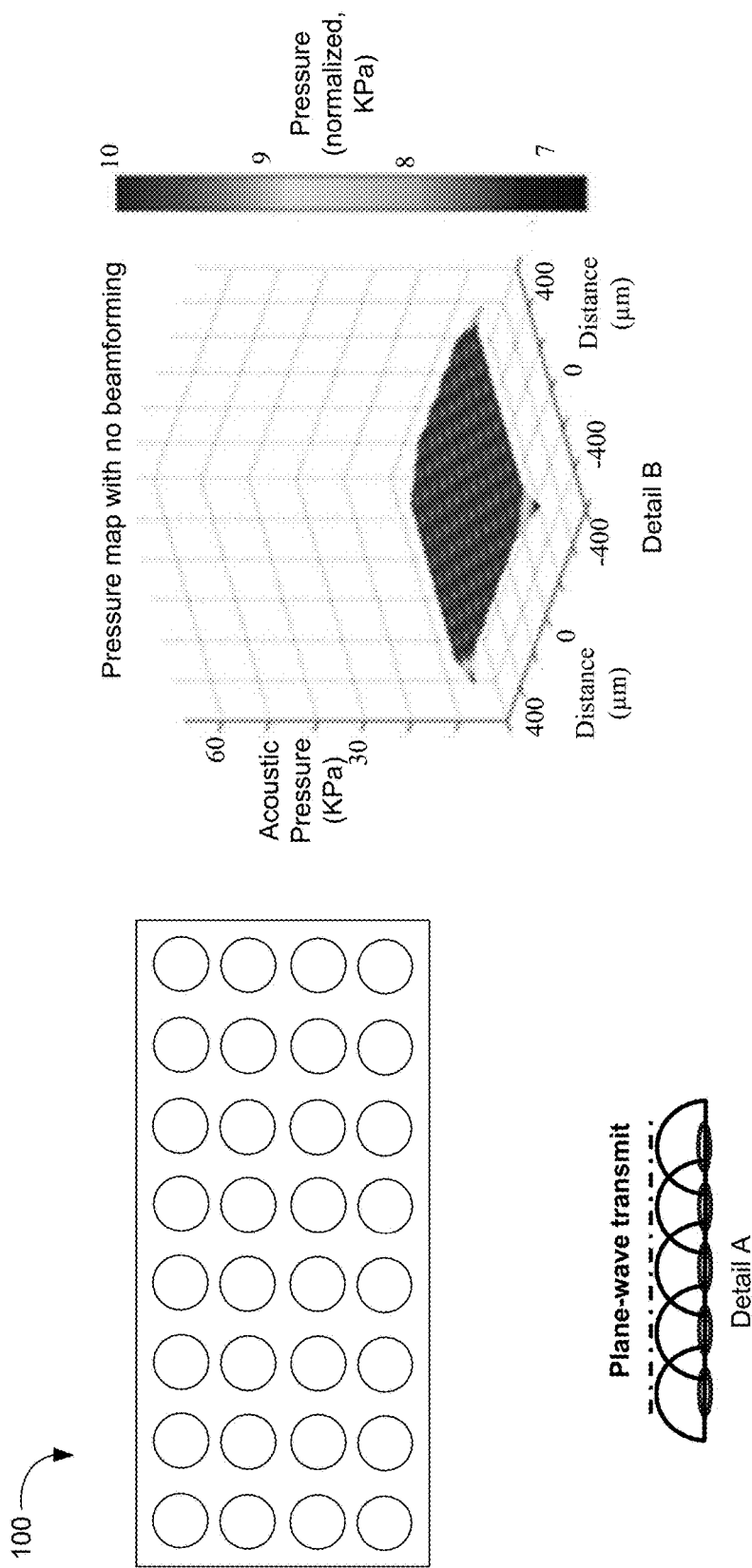
FIG. 1A illustrates an example of plane wave excitation.

The following description is directed to certain implementations for the purposes of describing the innovative aspects of this disclosure. However, a person having ordinary skill in the art will readily recognize that the teachings herein may be applied in a multitude of different ways. The described implementations may be implemented in any device, apparatus, or system that includes an ultrasonic sensor or emitter. For example, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, handwriting digitizers, fingerprint detectors, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), mobile health devices, computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also may be used in applications such as, but not limited to, electronic switching devices, radio frequency filters, sensors, accelerometers, gyroscopes, motion-sensing devices, fingerprint sensing devices, gesture detection, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

The systems, methods and devices of the disclosure each have several innovative aspects, no single one of which is solely responsible for the desirable attributes disclosed herein. The subject matter described in this disclosure can be implemented in a piezoelectric micromechanical ultrasonic transducer (PMUT) certain aspects of which have been described in U.S. patent application Ser. No. 14/569,280, filed on Dec. 12, 2014 and entitled "MICROMECHANICAL ULTRASONIC TRANSDUCERS AND DISPLAY," and in U.S. patent application Ser. No. 14/569,256, filed on Dec. 12, 2014 and entitled "PIEZOELECTRIC ULTRASONIC TRANSDUCER AND PROCESS," each assigned to the assignee of the present invention and hereby incorporated by reference into the present application in its entirety for all purposes. One innovative aspect of the subject matter described in this disclosure can be implemented by a PMUT array and associated electronics capable of performing, nearly simultaneously, both imaging of surface topography of a finger and imaging of subdermal tissue of the finger. Finger surface topography may consist of ridges, valleys and minutia that are typically used by fingerprint matching algorithms. Imaging of the subdermal tissue may provide additional three-dimensional (3-D) fingerprint information and may be used to provide additional security for authentication/verification. Further, 3-D fingerprint images may serve as a metric for finger liveness determination. Liveness determination is important to verify that an imaged fingerprint is from a living human digit and not a synthetic, dismembered or cadaver human digit. The presently disclosed techniques contemplate active beamforming techniques that enable a PMUT array to selectively switch between a first mode that provides high-resolution epidermal imaging, and a second mode that provides lower resolution and higher acoustic pressure appropriate for 3-D subdermal imaging and liveness determination of an object (purportedly a human finger of a live person) being imaged. In the second mode (the "beamforming mode") of operation, transmission-side beam forming may produce a relatively high acoustic pressure, focused beam pattern operable to produce acoustic echoes from subsurface layers of an object being imaged. The characteristic acoustic echoes from subcutaneous tissue (e.g., dermis or hypodermis) of a living human digit being difficult or impossible to spoof, the disclosed techniques enable a high confidence determination of whether or not subsurface features of the object being imaged is consistent with living subcutaneous tissue. Thus, a single apparatus may perform both fingerprint surface imaging and fingerprint 3-D imaging for additional security and liveness determination. Because the same PMUT array may be used for both fingerprint imaging and liveness determination, and each function may be performed within a few seconds or portion of a second, anti-spoofing protection may be provided for an existing ultrasonic fingerprint imaging system with little additional cost or user inconvenience. The active beamforming techniques permit selection of a desirably high frame rate and high resolution.

One innovative aspect of the subject matter described in this disclosure may be implemented in an apparatus that includes a one- or two-dimensional array of piezoelectric micromechanical ultrasonic transducer (PMUT) elements positioned below, beside, with, on or above a backplane of a display or an ultrasonic fingerprint sensor array.

In some implementations, the PMUT array may be configurable to operate in modes corresponding to multiple frequency ranges. In some implementations, for example, the PMUT array may be configurable to operate in a low-frequency mode corresponding to a low-frequency range (e.g., 50 kHz to 200 kHz) or in a high-frequency mode corresponding to a high-frequency range (e.g., 1 MHz to 25 MHz). When operating in the high-frequency mode, an apparatus may be capable of imaging at relatively higher resolution. Accordingly, the apparatus may be capable of detecting touch, fingerprint, stylus, and biometric information from an object such as a finger placed on the surface of the display or sensor array. Such a high-frequency mode may be referred to herein as a fingerprint sensor mode.

When operating in the low-frequency mode, the apparatus may be capable of emitting sound waves that are capable of relatively greater penetration into air than when the apparatus is operating in the high-frequency mode. Such lower-frequency sound waves may be transmitted through various overlying layers including a cover glass, a touchscreen, a display array, a backlight, a housing or enclosure, or other layers positioned between an ultrasonic transmitter and a display or sensor surface. In some implementations, a port may be opened through one or more of the overlying layers to optimize acoustic coupling from the PMUT array into air. The lower-frequency sound waves may be transmitted through the air above the display or sensor surface, reflected from one or more objects near the surface, transmitted through the air and back through the overlying layers, and detected by an ultrasonic receiver. Accordingly, when operating in the low-frequency mode, the apparatus may be capable of operating in a gesture detection mode, wherein free-space gestures near but not necessarily touching the display may be detected.

Alternatively, or additionally, in some implementations, the PMUT array may be configurable to operate in a medium-frequency mode corresponding to a frequency range between the low-frequency range and the high-frequency range (e.g., about 200 kHz to about 1 MHz). When operating in the medium-frequency mode, the apparatus may be capable of providing touch sensor functionality, although with somewhat less resolution than the high-frequency mode.

The PMUT array may be addressable for wavefront beam forming, beam steering, receive-side beam forming, and/or selective readout of returned signals. For example, individual columns, rows, sensor pixels and/or groups of sensor pixels may be separately addressable. A control system may control an array of transmitters to produce wavefronts of a particular shape, such as planar, circular or cylindrical wavefronts. The control system may control the magnitude and/or phase of the array of transmitters to produce constructive or destructive interference in desired locations. For example, the control system may control the magnitude and/or phase of the array of transmitters to produce constructive interference in one or more locations in which a touch or gesture has been detected or is likely to be detected.

In some implementations, PMUT devices may be co-fabricated with thin-film transistor (TFT) circuitry or CMOS circuitry on the same substrate, which may be a silicon, glass or plastic substrate in some examples. The TFT substrate may include row and column addressing electronics, multiplexers, local amplification stages and control circuitry. In some implementations, an interface circuit including a driver stage and a sense stage may be used to excite a PMUT device and detect responses from the same device. In other implementations, a first PMUT device may serve as an acoustic or ultrasonic transmitter and a second PMUT device may serve as an acoustic or ultrasonic receiver. In some configurations, different PMUT devices may be capable of low- and high-frequency operation (e.g. for gestures and for fingerprint detection). In other configurations, the same PMUT device may be used for low- and high-frequency operation. In some implementations, the PMUT may be fabricated using a silicon wafer with active silicon circuits fabricated in the silicon wafer. The active silicon circuits may include electronics for the functioning of the PMUT or PMUT array.

Figure 1B:
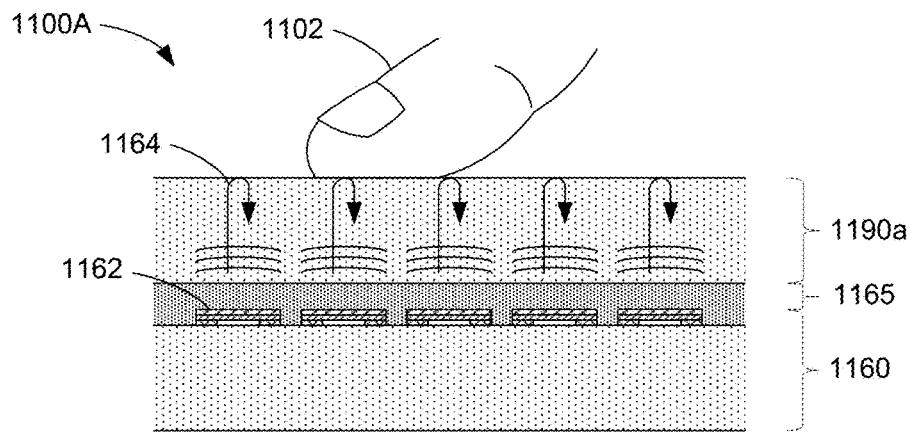
FIGS. 1B-1D illustrate cross-sectional views of various configurations of PMUT ultrasonic sensor arrays.
Figure 1C:
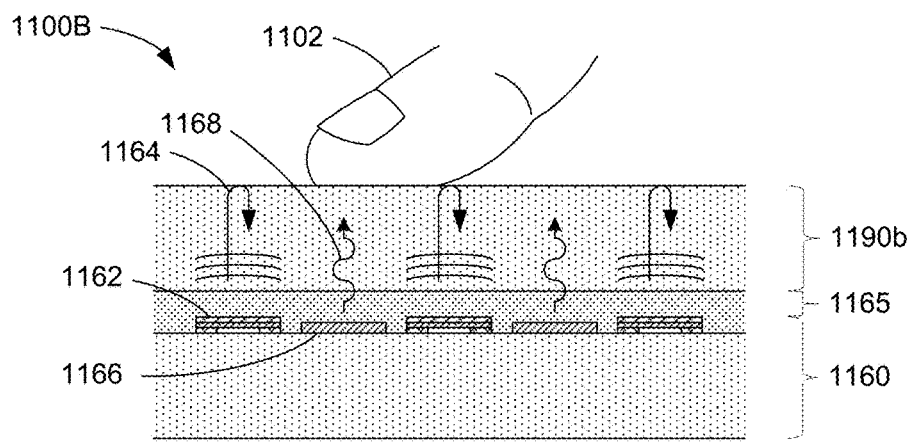
Figure 1D:
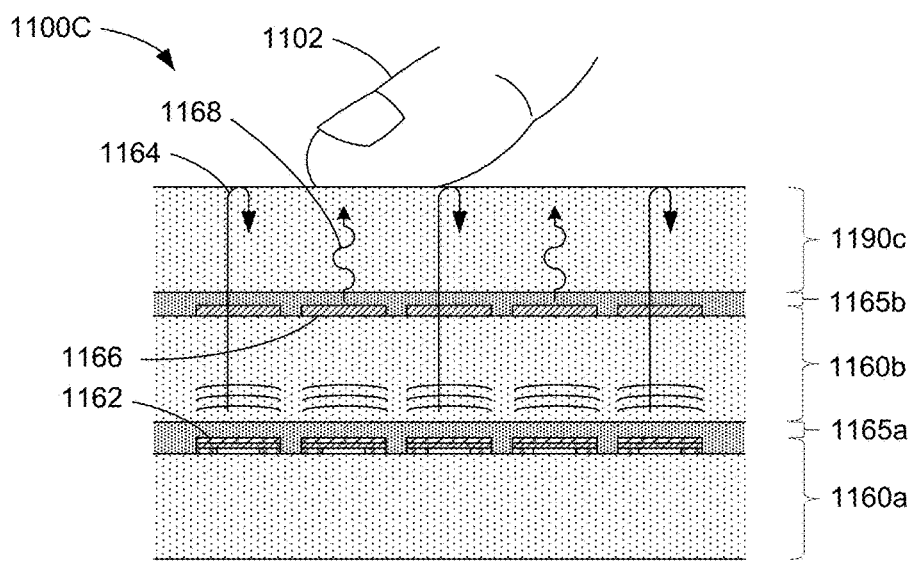

In some implementations the PMUT array may be configured as an ultrasonic sensor array. FIGS. 1B-1D illustrate cross-sectional views of various configurations of PMUT ultrasonic sensor arrays. FIG. 1B depicts an ultrasonic sensor array 1100A with PMUTs as transmitting and receiving elements that may be used, for example, as an ultrasonic fingerprint sensor, an ultrasonic touchpad, or an ultrasonic imager. PMUT sensor elements 1162 on a PMUT sensor array substrate 1160 may emit and detect ultrasonic waves. As illustrated, an ultrasonic wave 1164 may be transmitted from at least one PMUT sensor element 1162. The ultrasonic wave 1164 may travel through an acoustic coupling medium 1165 and a platen 1190a towards an object 1102 such as a finger or a stylus positioned on an outer surface of the platen 1190a. A portion of the ultrasonic wave 1164 may be transmitted through the platen 1190a and into the object 1102, while a second portion is reflected from the surface of platen 1190a back towards the sensor element 1162. The amplitude of the reflected wave may depend in part on the acoustic properties of the object 1102. The reflected wave may be detected by the sensor elements 1162, from which an image of the object 1102 may be acquired. For example, with sensor arrays having a pitch of about 50 microns (about 500 pixels per inch), ridges and valleys of a fingerprint may be detected. An acoustic coupling medium 1165 such as an adhesive, gel, a compliant layer or other acoustic coupling material may be provided to improve coupling between an array of PMUT sensor elements 1162 disposed on the sensor array substrate 1160 and the platen 1190a. The acoustic coupling medium 1165 may aid in the transmission of ultrasonic waves to and from the sensor elements 1162. The platen 1190a may include, for example, a layer of glass, plastic, sapphire, metal, metal alloy, or other platen material. An acoustic impedance matching layer (not shown) may be disposed on an outer surface of the platen 1190a. The platen 1190a may include a coating (not shown) on the outer surface.

FIG. 1C depicts an ultrasonic sensor and display array 1100B with PMUT sensor elements 1162 and display pixels 1166 co-fabricated on a sensor and display substrate 1160. The sensor elements 1162 and display pixels 1166 may be collocated in each cell of an array of cells. In some implementations, the sensor element 1162 and the display pixel 1166 may be fabricated side-by-side within the same cell. In some implementations, part or all of the sensor elements 1162 may be fabricated above or below the display pixel 1166. Platen 1190b may be positioned over the sensor elements 1162 and the display pixels 1166 and may function as or include a cover lens or cover glass. The cover glass may include one or more layers of materials such as glass, plastic or sapphire, and may include provisions for a capacitive touchscreen. An acoustic impedance matching layer or coating (not shown) may be disposed on an outer surface of the platen 1190b. Ultrasonic waves 1164 may be transmitted and received from one or more sensor elements 1162 to provide imaging capability for an object 1102 such as a stylus or a finger placed on the cover glass 1190b. The cover glass 1190b is substantially transparent to allow optical light from the array of display pixels 1166 to be viewed by a user through the cover glass 1190b. The user may choose to touch a portion of the cover glass 1190b, and that touch may be detected by the ultrasonic sensor array. Biometric information such as fingerprint information may be acquired, for example, when a user touches the surface of the cover glass 1190b. An acoustic coupling medium 1165 such as an adhesive, gel, or other acoustic coupling material may be provided to improve acoustic, optical and mechanical coupling between the sensor array substrate 1160 and the cover glass. In some implementations, the coupling medium 1165 may be a liquid crystal material that may serve as part of a liquid crystal display (LCD). In LCD implementations, a backlight (not shown) may be optically coupled to the sensor and display substrate 1160. In some implementations, the display pixels 1166 may be part of an amorphous light-emitting diode (AMOLED) display with light-emitting display pixels. In some implementations, the ultrasonic sensor and display array 1100B may be used for display purposes and for touch, stylus or fingerprint detection.

FIG. 1D depicts an ultrasonic sensor and display array 1100C with a sensor array substrate 1160a positioned behind a display array substrate 1160b. An acoustic coupling medium 1165a may be used to acoustically couple the sensor array substrate 1160a to the display array substrate 1160b. An optical and acoustic coupling medium 1165b may be used to optically and acoustically couple the sensor array substrate 1160*a* and the display array substrate 1160*b* to a cover lens or cover glass 1190*c*, which may also serve as a platen for the detection of fingerprints. An acoustic impedance matching layer or coating (not shown) may be disposed on an outer surface of the platen 1190*c*. Ultrasonic waves 1164 transmitted from one or more sensor elements 1162 may travel through the display array substrate 1160*b* and cover glass 1190*c*, reflect from an outer surface of the cover glass 1190*c*, and travel back towards the sensor array substrate 1160*a* where the reflected ultrasonic waves may be detected and image information acquired. In some implementations, the ultrasonic sensor and display array 1100C may be used for providing visual information to a user and for touch, stylus or fingerprint detection from the user. Alternatively, a PMUT sensor array may be formed on the backside of the display array substrate 1160*b*. Alternatively, the sensor array substrate 1160*a* with a PMUT sensor array may be attached to the backside of the display array substrate 1160*b*, with the backside of the sensor array substrate 1160*a* attached directly to the backside of the display array substrate 1160*b*, for example, with an adhesive layer or adhesive material (not shown).

Techniques for spoofing a human fingerprint have advanced to the point that at least the perceived reliability and security of this form of biometric authentication has been called into question. Spoofing may include use of synthetic objects having a surface that mimics a human fingerprint's ridge and valley characteristics. Spoofing may also involve the use of real human digits, dismembered from a living or dead human victim.

Figure 2:
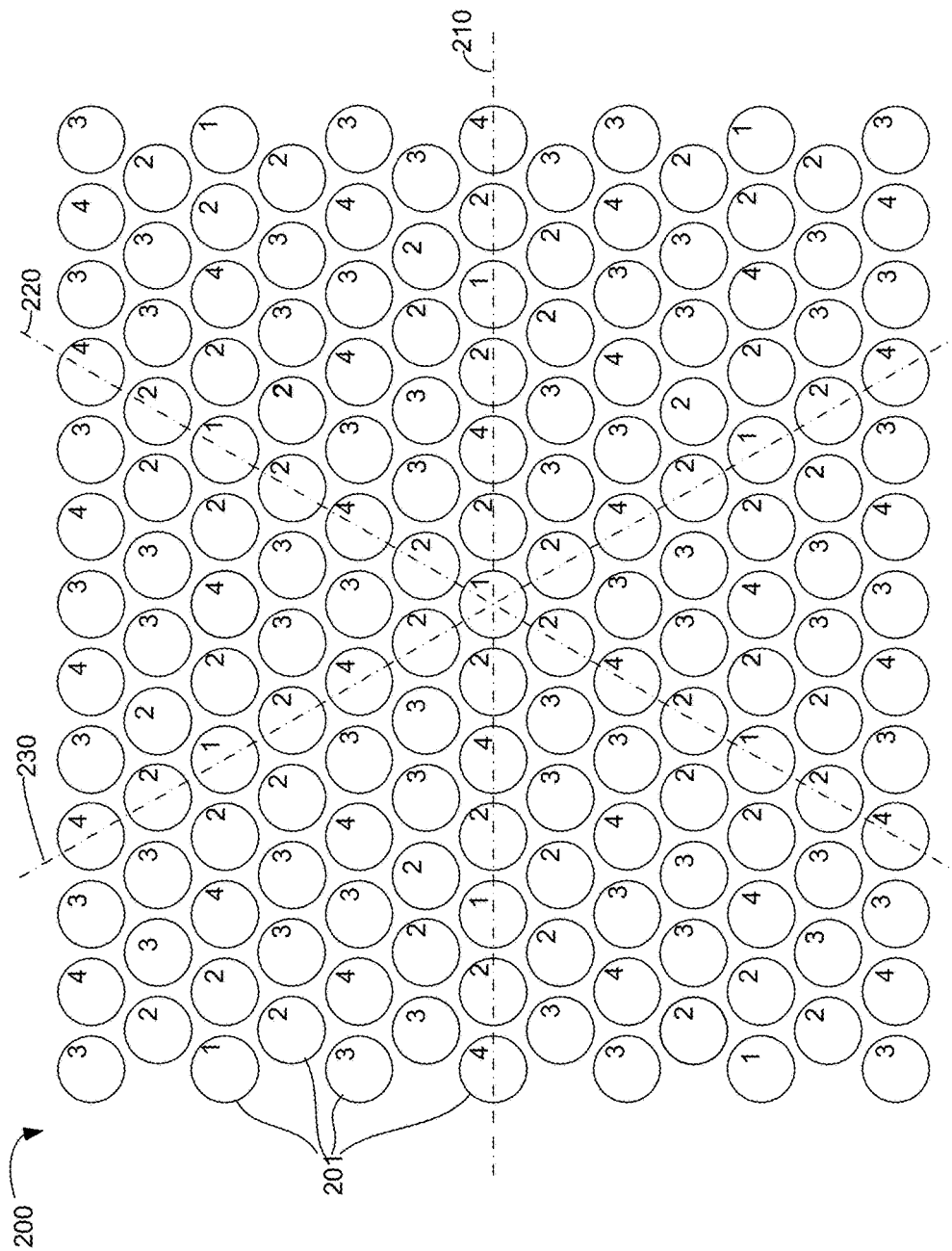
FIG. 2 illustrates a PMUT array according to an implementation.

The presently disclosed techniques contemplate a PMUT array that is operable both for fingerprint imaging and spoofing prevention. FIG. 2 illustrates a PMUT array according to an implementation. In the illustrated example, the PMUT array 200 includes 163 PMUT elements or PMUTs 201. Each PMUT element 201 may correspond to or be referred to as a "pixel". In the illustrated example, the PMUT array 200 includes an arrangement of alternating rows of pixels that are "staggered" such that PMUT elements in alternate rows are shifted by half a pitch distance between adjacent pixels within a row. Such an arrangement may also be referred to as a "hexagonal lattice" by which is meant a honeycomb-like arrangement of pixels configured such that any pixel, other than an edge pixel, is adjacent to six neighboring pixels, rows of adjacent pixels being disposed along or parallel to one of three principle axes, each of the three principle axes being disposed at an approximately equal angular separation with respect to the other two axes. In the illustrated example, first axis 210 is disposed horizontally, whereas second axis 220 and third axis 230 are disposed respectively at +60 degrees and −60 degrees inclination with respect to the horizontal axis.

Figure 3:
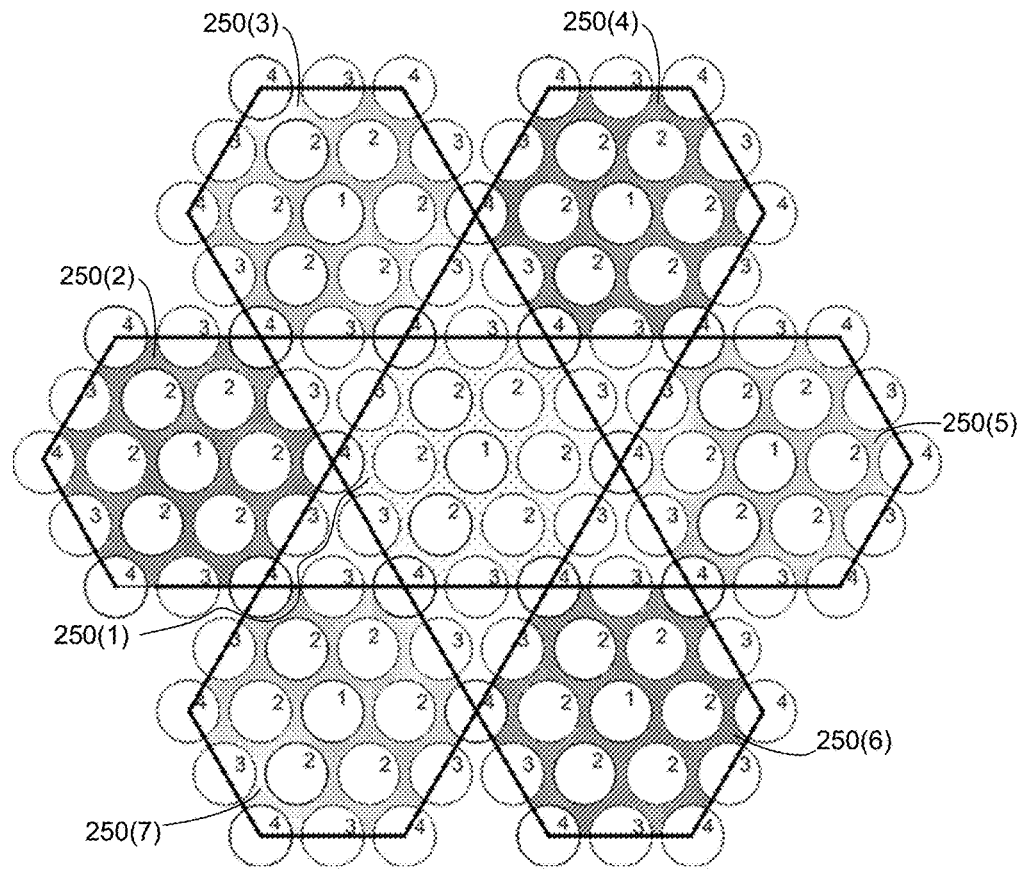
FIG. 3 shows a portion of a PMUT array according to some implementations.

Referring still to FIG. 2, it may be observed that each pixel 201 in PMUT array 200 has been annotated with an integer number: 1, 2, 3 or 4. The meaning of the annotation may be better appreciated by referring to FIG. 3, which shows a portion of PMUT array 200, according to some implementations. More particularly, the illustrated portion of PMUT array 200 that includes 121 pixels 201 that are disposed so as to form seven "superpixel" regions 250. A "superpixel", as the term is used herein and in the claims, means a plurality of pixels, including at least one inner pixel disposed in a central portion of a superpixel region, and one or more sets (e.g. rings) of outer pixels disposed in an outer portion of the superpixel region. As illustrated in FIG. 3, a superpixel may include a single center pixel and one or more rings of pixels that surround the center pixel, each pixel in a ring of pixels having a substantially equal distance from the center pixel.

More particularly, in the implementation illustrated in FIG. 3, each of seven hexagonal superpixel regions 250(*i*) includes a respective inner pixel (annotated by the integer '1') located proximate to a center of the superpixel region. An inner pixel 1 may also be referred to as a "center pixel". In the illustrated implementation, a single center pixel is disposed proximate to the center of each superpixel region. More generally however, a first group or set of inner pixels ("first pixel set") may be contemplated that are disposed proximate to and equidistant from the center of each superpixel region.

Each superpixel region 250 also includes outer pixels disposed in an outer portion of the superpixel region 250. In the illustrated example, each superpixel region 250 includes a second set or group of outer pixels ("second pixel set"), annotated by the integer '2'. Six outer pixels 2 are shown to be proximate to and substantially equidistant from each respective center pixel 1. In the illustrated example, each superpixel region 250 also includes a third pixel set that includes outer pixels that are disposed on a boundary of each superpixel region. Pixels in the third pixel set, annotated by the integer '3', are disposed proximate to a center of each edge of the hexagonal superpixel region 250 and are substantially equidistant from the center pixel 1. A fourth pixel set includes outer pixels annotated by the integer '4' that are disposed proximate to each corner of the hexagonal superpixel region 250, and are substantially equidistant from the center pixel 1.

It will be appreciated that outer pixels 3 are more distant from the center pixel 1 than outer pixels 2, and less distant from the center pixel 1 than outer pixels 4. Thus, PMUT elements in a superpixel may be grouped according to their position from the center of the superpixel. In some implementations, one or more sets or groups of outer pixels may be shared between adjacent superpixels. In the example implementation illustrated in FIG. 3, pixels of the fourth pixel set may be shared between adjacent superpixels.

As will be explained in more detail hereinbelow, each PMUT element in each pixel set may be systematically coupled with transceiver electronics, such that the pixel sets may be separately actuated with a transmission signal having a controllable phase and/or time delay. When plane wave excitation and transmission is desired, appropriate for fingerprint imaging, for example, this may be achieved by applying substantially the same delay to all groups of PMUT elements in the superpixel. Alternatively, in a beam-focusing or transmit-side beamforming mode, the time delay for each respective pixel set may be selected so that the acoustic pressure created by each superpixel is focused at a predetermined distance from the center pixel(s) using beamforming principles.

Figure 4:
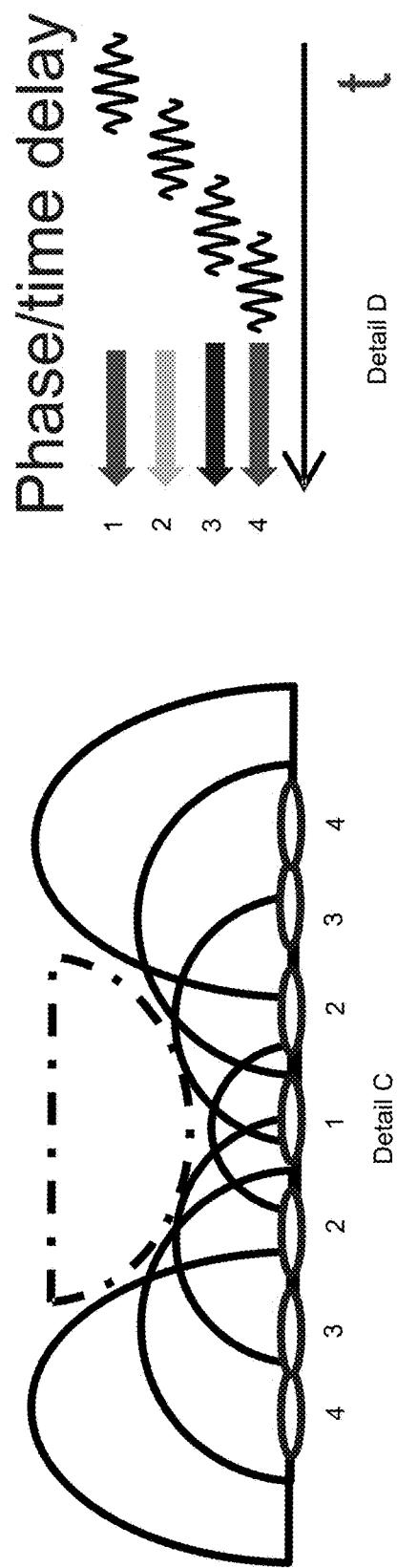
FIG. 4 illustrates an example of beam forming for a superpixel region.

FIG. 4 illustrates an example of beam focusing or transmitter side beamforming for a superpixel region including pixel sets as described above. By appropriately applying phase/time delays to each respective pixel set, time of flight and constructive interference between ultrasonic emissions from each group of PMUT elements within the superpixel may result in a focused, highly shaped, and relatively high intensity ultrasonic signal. For example, each pixel set may be supplied with a transmission signal having a predetermined time delay. The time delay for each pixel set may be selected so that the acoustic pressure created by each superpixel is focused at a predetermined location. As illustrated in FIG. 4, the ultrasonic emissions from a superpixel may be focused by first applying an excitation signal to the fourth pixel set; following a time delay, applying the excitation signal to the third pixel set; following another time delay, applying the excitation signal to the second pixel set; and, following yet a further time delay, applying the excitation signal to the center pixel (or first pixel set) as shown in Detail D. As a result, a focused beam of relatively high acoustic pressure may be generated proximate to the center of the superpixel region as shown in Detail C.

Figure 5:
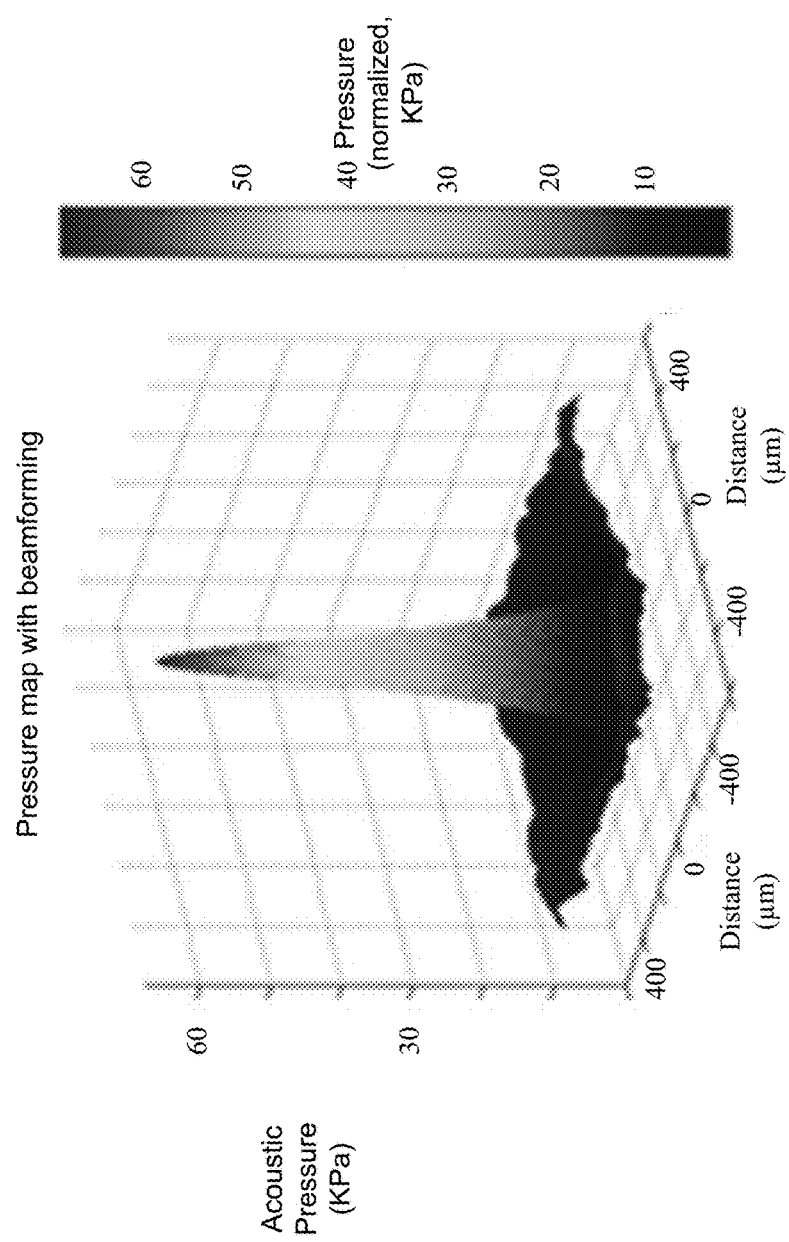
FIG. 5 illustrates an example acoustic pressure map for a superpixel of PMUT elements operated in a beamforming mode.

FIG. 5 illustrates an example acoustic pressure map for a superpixel of PMUT elements operated in a beamforming mode. It may be observed that the superpixel may generate a well-focused beam having relatively high acoustic pressure at a distance of interest along the thickness direction of the object being imaged. The focused beam may have an acoustic pressure that is substantially higher (at least 2×  higher) than the average acoustic pressure produced when operating in a plane wave excitation transmission mode. In the illustrated example, the peak acoustic pressure is approximately six times greater than the average acoustic pressure produced when operating in a plane wave excitation and transmission mode (e.g., comparing FIG. 5 with FIG. 1A, Detail B). The distance of interest (which may correspond to a selected depth of focus) is determined by the spacing between pixel sets 250(1) through 250(4) and configurable time delays. By controlling the time delays between pixel sets 250(1) through 250(4) of the superpixel region 250, different depths of the finger tissue may be imaged to provide 3-D tissue imaging as well as liveness determination.

Each of the example superpixels 250(i) illustrated in FIG. 3 may be characterized as including 19 pixels arranged along a hexagonal lattice. It should be noted that any number of alternative superpixel arrangements are contemplated by the present disclosure, provided only that the superpixel includes, as defined above, a plurality of pixels, including at least one inner pixel disposed in a central portion of a superpixel region, and one or more sets of outer pixels disposed in an outer portion of the superpixel region.

Application of different phase/time delays to respective pixel sets of PMUT elements within each superpixel of an array of superpixels may be accomplished in a variety of ways. For example, a "passive" array of superpixels may be contemplated, wherein each PMUT element within a group of PMUTs is hardwired in common to transceiver electronics, and actuated ("fired") simultaneously. Successive groups of PMUTs may be fired in a sequence controlled by the transceiver electronics so as to provide the desired phase/time delays to each respective group. In such a passive array, the size and relative spacing of each of the superpixels is fixed at the time of manufacture. As a result, the spatial resolution of the PMUT array in the beamforming mode may also be fixed.

In order to provide an ability to flexibly select a desired spatial resolution in the beamforming mode, the presently disclosed techniques contemplate selective addressing of individual pixels and superpixels. For example, a serial interface structure may be used to clock in configuration information to each pixel and associate each pixel with a corresponding superpixel.

Figure 6:
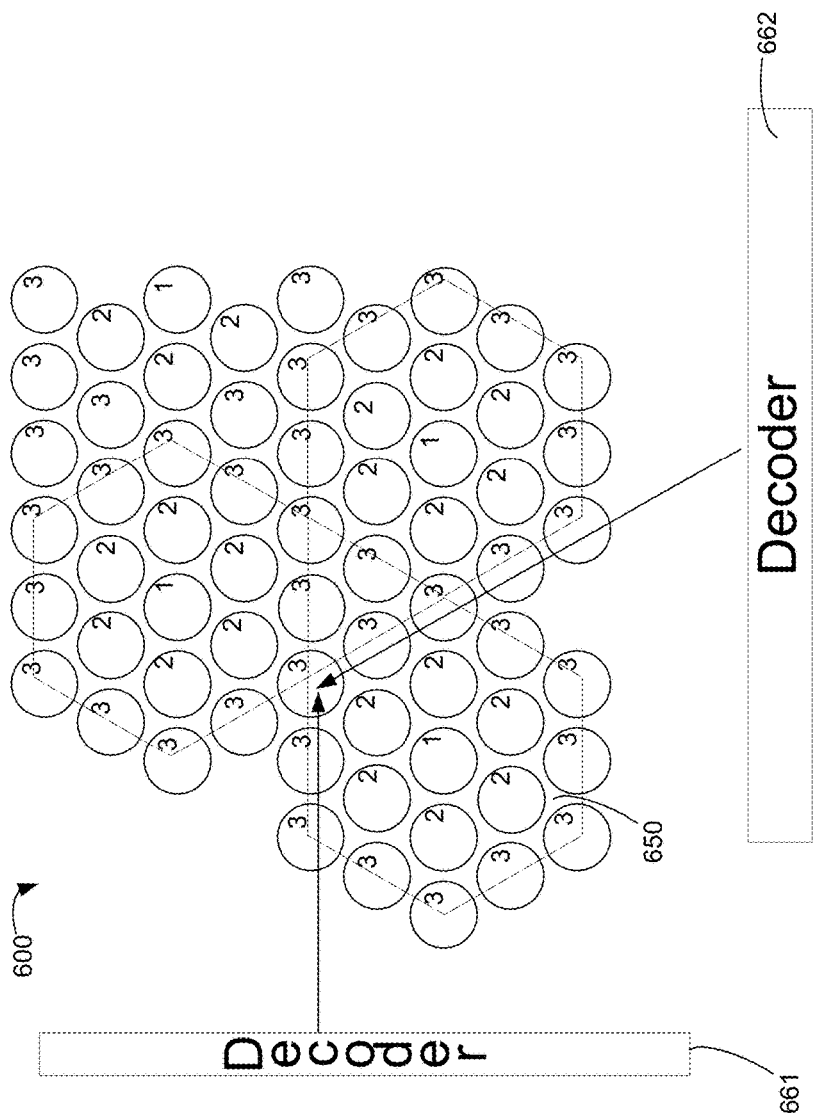
FIG. 6 illustrates a portion of an arrangement of pixels according to an implementation.

FIG. 6 illustrates a portion of an arrangement of pixels according to an implementation. In the illustrated arrangement 600, each superpixel 650 includes a center pixel (1), a first pixel set of six outer pixels (2), and a second pixel set of 12 outer pixels (3). In the illustrated implementation, the second pixel set of 12 outer pixels (3) in FIG. 6 includes pixel locations corresponding to both outer pixels (3) and outer pixels (4) as shown in FIGS. 2 and 3. Any pixel in the array may be addressed by respective row decoder 661 and column decoder 662. The row decoder 661 and the column decoder 662 may be a component of the transceiver electronics, for example, and may be configured to designate any individual pixel as a center pixel (1), an outer pixel (2), or an outer pixel (3).

Figure 7:
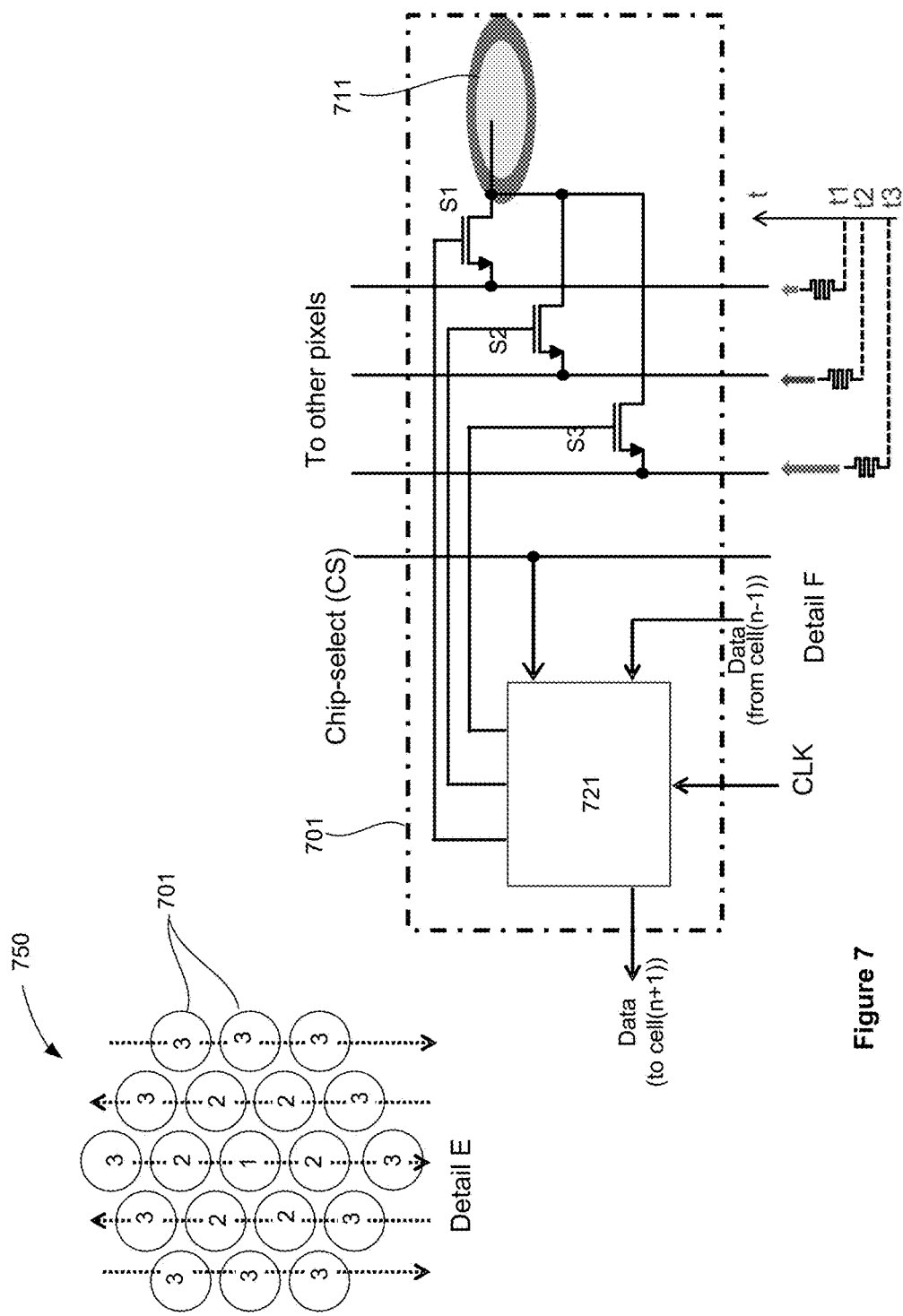
FIG. 7 illustrates a serial interface structure that may be used to clock in beamforming configuration information to each pixel, according to an implementation.

FIG. 7 illustrates a serial interface structure that may be used to clock in beamforming configuration information to each pixel, according to an implementation. In the illustrated implementation, referring now to Detail E of FIG. 7, each of the 19 pixels 701 in a superpixel arrangement 750 may be addressed by column and row decoders 661 and 662 and designated as one of a center pixel (1), an outer pixel (2), or an outer pixel (3). Referring now to Detail F of FIG. 7, each pixel 701 may include a transmit electrode 711, in-cell pixel logic 721 and pass transistors S1, S2 and S3. The transmit electrode 711 may be energized (e.g., the PMUT element is fired) at a selected one of delay times t1, t2 and t3, the selection being determined by the switch states of transistors S1, S2 and S3.

In the illustrated implementation, the switch states of transistors S1, S2 and S3 may be set by in-cell pixel logic 721. In some implementations, the pixel logic 721 may include a 2-bit memory, a 2-bit decoder, and a 2-bit shift register. The pixel logic 721 may be addressed and configured by the decoders 661 and 662, a process which may require two clock cycles. As a result, when the pixels are addressed as contemplated by the arrangement shown in FIG. 7, approximately 38 clock cycles are required to configure all of the 19 pixels in the superpixel arrangement 750.

The above-described implementation, unlike the passive array, allows selectively making a designation of any pixel as a center pixel (1), outer pixel (2) or outer pixel (3). Upon being designated as a center pixel (1), outer pixel (2) or outer pixel (3), logic 721 may set the respective switch states of each of transistors S1, S2, and S3 of the center pixel and the outer pixels in the superpixel so that each group of PMUT elements in the superpixel is fired only at a selected one of delay times t1, t2 and t3 that is appropriate for the designation. For example, outer pixels (3) may be fired at a shorter delay time t1, outer pixels (2) may be fired at an intermediate delay time t2, and center pixel (1) may be fired at a longer delay time t3.

In some implementations, the designation of various pixels in the pixel array as a center pixel (1), outer pixel (2) or outer pixel (3) may be changed temporally in order, for example, to support scanning. As a result, for example, a high resolution scan of a focused beam of relatively high acoustic pressure may be performed across an entire area of the array or any part of the array area.

Figure 8:
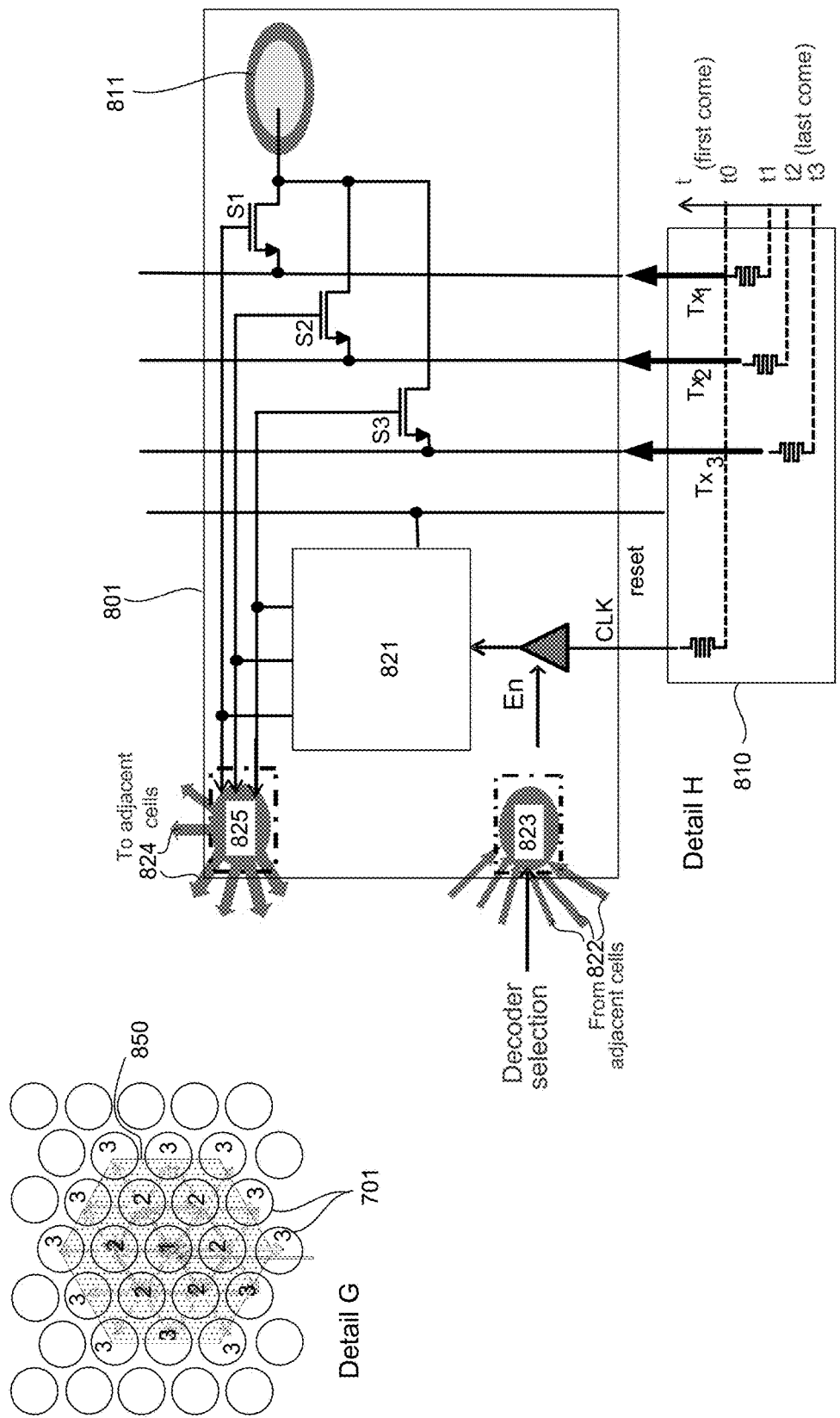
FIG. 8 illustrates another technique for operating an array of pixels by configuring in-cell pixel logic, according to an implementation.

FIG. 8 illustrates another technique for operating an array of pixels by configuring in-cell pixel logic, according to an implementation. In the illustrated implementation, referring now to Detail G of FIG. 8, a center pixel (1) in a superpixel 850 is designated a center pixel (1) by, for example, a decoder disposed in the transceiver electronics.

Referring now to Detail H of FIG. 8, each pixel 801, including the center pixel (1), may include a transmit electrode 811, in-cell pixel logic 821, cell input interface logic 823, cell output interface logic 825, and pass transistors S1, S2 and S3 that receive signals from transceiver electronics 810. The transmit electrode 811 may be energized (e.g., the PMUT element may be fired) at a selected one of delay times t1, t2 and t3, the selection being determined by the switch states of transistors S1, S2 and S3.

In the illustrated implementation, the switch states of transistors S1, S2 and S3 may be set by in-cell pixel logic 821. In some implementations, the pixel logic 821 may include a 2-bit encoder and a 2-bit counter. The logic 821 may process inputs from cell input interface logic 823. In some implementations, cell input interface logic 823 may be a 7-input OR gate that receives inputs from (i) each of six adjacent cells and (ii) the decoder. The inputs from any of six adjacent cells may be a "wake-up" signal 822, meaning that the adjacent cell is a center cell or has been awakened by a center cell.

Figure 9:
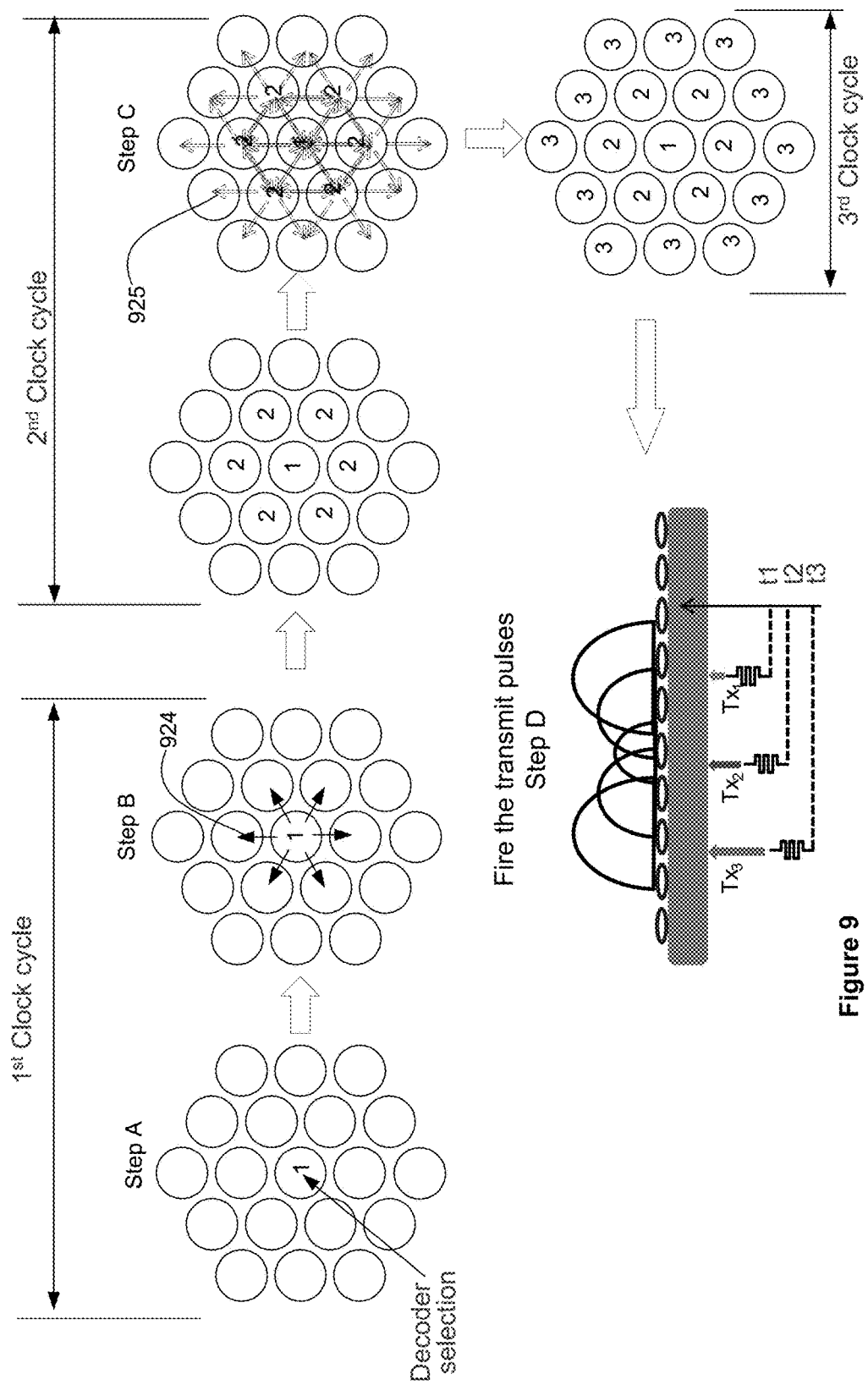
FIG. 9 illustrates additional details of operating an array of pixels by configuring in-cell pixel logic, according to an implementation.

FIG. 9 illustrates additional details of operating an array of pixels by configuring in-cell pixel logic, according to an implementation. When center pixel (1) receives a decoder selection signal, Step A, a first clock cycle starts by enabling a CLK signal and the superpixel center pixel (1) distributes a wake-up signal 924 to six adjacent cells, Step B. Cells adjacent to center pixel (1) are each outer pixels (2). When an adjacent cell (outer pixel (2)) receives the wakeup signal it also starts to count at a second clock cycle and also distributes wakeup signals 925 to adjacent cells, Step C. After a third clock cycle, all the cells in the superpixel may be configured as one of a center pixel (1), an outer pixel (2) or an outer pixel (3). As a result, firing transmit pulses, Step D, may produce a well-focused beam of relatively high acoustic pressure.

The above-described implementation allows selectively making a designation of any pixel as a center pixel (1) of a superpixel, following which designation, logic residing locally on each pixel permits a fast designation of each of the remaining pixels in the superpixel as either an outer pixel (2) or an outer pixel (3). Upon being designated as a center pixel (1), outer pixel (2) or outer pixel (3), logic 821 sets the respective switch states of each of transistors S1, S2 and S3 so that each PMUT element is fired only after the one of delay times t1, t2 and t3 that is appropriate for the designation. For example, outer pixels (3) may be fired at a shorter delay time t1, outer pixels (2) may be fired at an intermediate delay time t2, and center pixel (1) may be fired at a longer delay time t3. In some implementations, the designation of a pixel as a center pixel (1), outer pixel (2) or outer pixel (3) may be changed temporally in order, for example, to support scanning. As a result, a high resolution scan of a focused beam of relatively high acoustic pressure may be performed across an entire area of the array or any part of the array area.

With respect to FIG. 9, in some implementations, the center pixel (1) and all outer pixels (2, 3, . . . ) may be set to have a logic state "00" stored in their respective in-cell pixel logic prior to the start of Step A. At step A, during a first clock cycle, a decoder selection signal may be sent from a row and/or a column decoder to a designated superpixel center pixel (1), loading a logic state "01" into the two-bit memory of the in-cell pixel logic associated with the superpixel center pixel (1). During the same clock cycle, at Step B, the update of the in-cell memory may trigger a wake-up signal via the cell output interface logic to six adjacent cells (outer pixels (2)) that are adjacent to the center pixel (1). During a second clock cycle, the center pixel (1) may receive a second decoder selection signal. A logic state "10" may be loaded into the in-cell memory of the center pixel (1) and a memory update signal may be sent to the six adjacent outer pixels (2) and a logic state "01" may be loaded via the cell input interface logic into the in-cell memory of the adjacent outer pixels (2). At Step C, the update of the in-cell memory of the adjacent outer pixels (2) may trigger a wake-up signal to twelve adjacent outer pixels (3) that are adjacent to the six outer pixels (2). During a third clock cycle, the center pixel (1) may receive a third decoder selection signal. A logic state "11" may be loaded into the in-cell memory of the center pixel (1) and a memory update signal may be sent to the six adjacent outer pixels (2), causing a logic state "10" to be loaded into the in-cell memory of the outer pixels (2) and causing a memory update signal to be sent to the twelve adjacent outer pixels (3) and a logic state "01" to be loaded into the in-cell memory of the outer pixels (3). The logic states "01", "10" and "11" stored in the in-cell memories of inner pixels (1), outer pixels (2) and outer pixels (3), respectively, may be decoded with an in-cell 2-bit decoder to turn on corresponding pass transistors S1, S2 or S3, which may gate or otherwise allow transmit signals with corresponding delay times to be passed on to one or more transmit electrodes of the in-cell PMUT, allowing the corresponding PMUTs of the superpixel to launch a focused ultrasonic wave. In some implementations, a two-bit shift register may be used as the in-cell decoder to provide appropriate logic levels to turn on or off the corresponding pass transistors. Scanning an object may occur by resetting the in-cell pixel logic of the center pixel (1) and outer pixels (2, 3), then re-starting the process with a different pixel designated in the PMUT array to serve as the center pixel (1).

Figure 10:
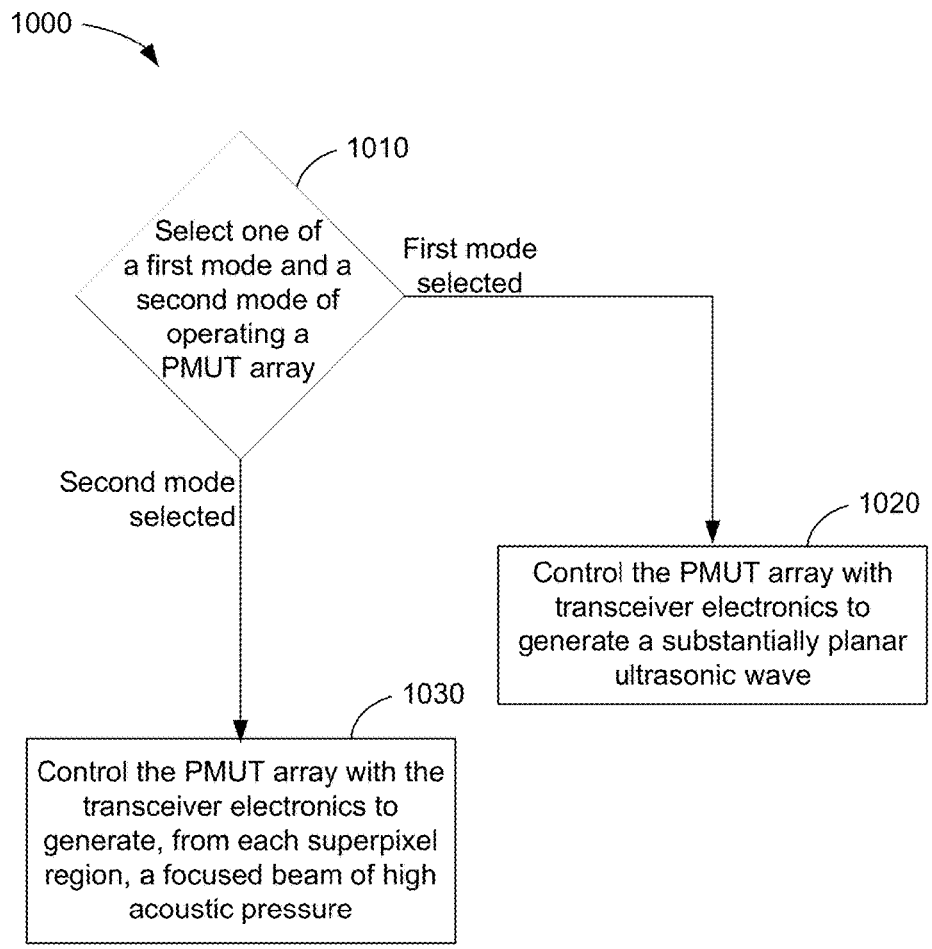
FIG. 10 illustrates an example of a process flow for operating an array of pixels in a selectable one of a first mode and a second mode.

FIG. 10 illustrates an example of a process flow for operating an array of pixels in a selectable one of a first mode and a second mode. As described hereinabove, each pixel may include in-cell pixel logic and a piezoelectric micromechanical ultrasonic transducer (PMUT), each in-cell pixel logic may be communicatively coupled with at least one adjacent pixel in the array and with transceiver electronics. The transceiver electronics may be configured to operate the array by configuring at least one in-cell pixel logic. In the illustrated implementation, method 1000 includes a step 1010 for selecting one of a first mode and a second mode of operating the PMUT array.

When the selection at step 1010 is to operate in the first mode, the method may proceed, at step 1020, to control a PMUT array with the transceiver electronics to generate a substantially plane ultrasonic wave. More particularly, in the first operating mode, the transceiver electronics may concurrently transmit signals to each PMUT in the array. The signals, being received at the input terminals substantially simultaneously, may cause the array to generate a substantially plane ultrasonic wave.

When the selection at step 1010 is to operate in the second mode, the method may proceed, at step 1030, to control a PMUT array with the transceiver electronics to generate from each superpixel region a focused beam of relatively higher acoustic pressure. In some implementations, the transceiver electronics may operate the array by configuring at least one in-cell pixel logic. For example, the transceiver electronics may use a serial interface structure to clock in configuration information to each pixel and associate each pixel with a corresponding superpixel. In some implementations, the transceiver electronics may designate at least one pixel as an inner pixel of a corresponding superpixel. Each of the designated inner pixel and at least a second pixel adjacent to the designated inner pixel may include cell input interface logic and cell output interface logic. The cell output interface logic of the designated inner pixel may be configured to send a wake-up signal to the cell input interface logic of the second pixel.

Thus, an arrangement, including an array of piezoelectric ultrasonic transducers configured as superpixels, operable to selectively perform either fingerprint imaging (e.g. epidermal imaging) or subdermal imaging (e.g. for liveness detection), has been disclosed. It will be appreciated that a number of alternative configurations and fabrication techniques may be contemplated. For example, in some implementations, receive-side beamforming with the PMUT arrays may be accomplished with a pixel array as largely described above including a plurality of pixels, with each pixel including a piezoelectric micromechanical ultrasonic transducer (PMUT) element. Each PMUT element in the pixel array may be disposed on a substrate that includes thin-film transistor (TFT) or CMOS circuitry co-fabricated with the PMUT element. The TFT or CMOS circuitry may include in-cell pixel logic element communicatively coupled with transceiver electronics. The in-cell pixel logic may include a 2-bit memory, a 2-bit decoder, and a 2-bit shift register. The transceiver electronics may include at least one decoder configured to address and configure the in-cell pixel logic. The decoders may be configured to selectably designate each pixel as an inner pixel or an outer pixel of a corresponding superpixel. The TFT or CMOS circuitry may include cell input interface logic, cell output interface logic and a plurality of pass transistors. The transceiver electronics may include at least one decoder communicatively coupled with the TFT circuitry and configured to selectably designate at least one pixel as an inner pixel. Each of the designated inner pixel and second pixels adjacent to the designated inner pixel may include cell input interface logic and cell output interface logic. The cell output interface logic of the designated inner pixel may be configured to send a wake-up signal to the cell input interface logic of the second pixel. The pass transistors may be configured to allow the acquisition of received ultrasonic signals by the PMUT element with in-cell acquisition circuitry, such as a peak detector (not shown), at a predetermined time $t1$, $t2$ or $t3$. The predetermined times $t1$, $t2$ and $t3$ may be separated by time delays that allow acquisition of received signals according to beamforming principles.

As a further example, the PMUT arrays may be operated in a non-beamformed mode (i.e. in a conventional mode) or in a receive-side beamforming mode. The array of pixels, each including in-cell pixel logic and a piezoelectric micromechanical ultrasonic transducer (PMUT) element, may be operated in a selectable one of a first receive mode and a second receive mode, with each in-cell pixel logic being communicatively coupled with at least one adjacent pixel in the array. Transceiver electronics may be configured to operate the array by configuring at least one in-cell pixel logic in either the first receive mode or the second receive mode. In the first receive mode, the array may be operated to receive ultrasonic signals at a single point in time. In the second receive mode, the array may be operated to receive ultrasonic signals at multiple points in time, allowing receive-side beamforming within a designated superpixel. Each superpixel region may include at least one inner pixel disposed in a central portion of the superpixel region and at least a first group of outer pixels disposed in an outer portion of the superpixel region. In the second receive mode, at least one in-cell pixel logic may be configured using a serial interface structure to clock in configuration information to each pixel and associate each pixel with a corresponding superpixel. The in-cell pixel logic may include, in the second receive mode, designating each pixel as a center pixel or as an outer pixel of the corresponding superpixel. The transceiver electronics may include one or more decoders that are configured to address and configure the in-cell pixel logic. The decoders may be configured to selectably designate each pixel as an inner pixel or an outer pixel of the corresponding superpixel. The decoders may be configured to selectably designate at least one pixel as an inner pixel, where each of the designated inner pixel and second pixels adjacent to the designated inner pixel include cell input interface logic and cell output interface logic. The cell output interface logic of the designated inner pixel may be configured to send a wake-up signal to the cell input interface logic of the outer pixels. The pass transistors may be configured to allow the acquisition of received ultrasonic signals at a predetermined time $t1$, $t2$ or $t3$ by in-cell acquisition circuitry, such as a peak detector. The predetermined times $t1$, $t2$ and $t3$ may be separated by time delays that allow acquisition of received signals according to beamforming principles.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor or any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by or to control the operation of data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module which may reside on a computer-readable medium. Computer-readable media include both computer storage media and communication media including any medium that can be enabled to transfer a computer program from one place to another. Storage media may be any available media that may be accessed by a computer. By way of example, and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, as a person having ordinary skill in the art will readily appreciate, the terms "upper" and "lower", "top" and "bottom", "front" and "back", and "over", "overlying", "on", "under" and "underlying" are sometimes used for ease of describing the figures and indicate relative positions corresponding to the orientation of the figure on a properly oriented page, and may not reflect the proper orientation of the device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising:
   an array of cells, each cell including a pixel, each pixel including a piezoelectric micromechanical ultrasonic transducer (PMUT) element disposed on a substrate and, disposed within the cell, on the substrate, an in-cell pixel logic, a cell output interface logic and a cell input interface logic, each in-cell pixel logic being communicatively coupled with the in-cell pixel logic of at least one adjacent pixel in the array; and
   transceiver electronics communicatively coupled with the array and configured to operate the array in a selectable one of a first mode and a second mode, wherein:
   in the first mode, the array generates a substantially plane ultrasonic wave having a first acoustic pressure;
   in the second mode, the array generates, from at least one superpixel region, a focused beam having a second acoustic pressure that is substantially higher than the first acoustic pressure, each superpixel region including at least one inner pixel disposed in a central portion of the superpixel region and at least a first group of outer pixels disposed in an outer portion of the superpixel region;
   the transceiver electronics is configured to operate the array by configuring at least one in-cell pixel logic and to selectably designate at least one pixel as an inner pixel and send a selection signal to the designated inner pixel; and
   upon the designated inner pixel receiving the selection signal, the cell output interface logic of the designated inner pixel is configured to send a wake-up signal to the cell input interface logic of a second pixel adjacent to the designated inner pixel.

2. The apparatus of claim 1, wherein the PMUT element is disposed on a substrate, the substrate including thin-film transistor (TFT) circuitry.

3. The apparatus of claim 2, wherein the TFT circuitry is co-fabricated with the PMUT element.

4. The apparatus of claim 2, wherein the TFT circuitry includes the in-cell pixel logic.

5. The apparatus of claim 1, wherein configuring the at least one in-cell pixel logic includes, in the second mode, using a serial interface structure to clock in configuration information to each pixel and associate each pixel with a corresponding superpixel.

6. The apparatus of claim 5, wherein configuring the at least one in-cell pixel logic includes, in the second mode, designating each pixel as a center pixel or an outer pixel of the corresponding superpixel.

7. The apparatus of claim 1, wherein the in-cell pixel logic includes a 2-bit memory, a 2-bit decoder, and a 2-bit shift register.

8. The apparatus of claim 1, wherein the transceiver electronics includes at least one decoder configured to address and configure the in-cell pixel logic.

9. The apparatus of claim 8, wherein the at least one decoder is configured to selectably designate each pixel as an inner pixel or an outer pixel of a corresponding superpixel.

10. The apparatus of claim 1, wherein the cell input interface logic is a seven input OR-gate configured to receive inputs from the decoder and from one or more adjacent pixels.

11. A non-transitory computer readable medium having software stored thereon, the software including instructions for causing an apparatus to:

operate an array of cells, each cell including a pixel, each pixel including a piezoelectric micromechanical ultrasonic transducer (PMUT) element disposed on a substrate and, disposed within the cell, on the substrate, an in-cell pixel logic, a cell output interface logic and a cell input interface logic, in a selectable one of a first mode and a second mode, each in-cell pixel logic being communicatively coupled with the in-cell pixel logic of at least one adjacent pixel in the array; wherein:

a transceiver electronics is configured to operate the array by configuring at least one in-cell pixel logic and to selectably designate at least one pixel as an inner pixel and send a selection signal to the designated inner pixel; and upon the designated inner pixel receiving the selection signal, the cell output interface logic of the designated inner pixel is configured to send a wake-up signal to the cell input interface logic of a second pixel adjacent to the designated inner pixel;

in the first mode, operating the array generates a substantially plane ultrasonic wave having a first acoustic pressure; and in the second mode, operating the array generates, from at least one superpixel region, a focused beam having a second acoustic pressure that is substantially higher than the first acoustic pressure, each superpixel region including at least one inner pixel disposed in a central portion of the superpixel region and at least a first group of outer pixels disposed in an outer portion of the superpixel region.

12. The computer readable medium of claim 11, wherein configuring the at least one in-cell pixel logic includes, in the second mode, using a serial interface structure to clock in configuration information to each pixel and associate each pixel with a corresponding superpixel.

13. The computer readable medium of claim 12, wherein configuring the at least one in-cell pixel logic includes, in the second mode, designating each pixel as a center pixel or an outer pixel of the corresponding superpixel.

14. The computer readable medium of claim 11, wherein the transceiver electronics includes at least one decoder configured to address and configure the in-cell pixel logic.

15. The computer readable medium of claim 14, wherein the at least one decoder is configured to selectably designate each pixel as an inner pixel or an outer pixel of a corresponding superpixel.

16. A method comprising:

operating an array of cells, each cell including a pixel, each pixel including a piezoelectric micromechanical ultrasonic transducer (PMUT) element disposed on a substrate and, disposed within the cell, on the substrate, an in-cell pixel logic, a cell output interface logic and a cell input interface logic, in a selectable one of a first mode and a second mode, each in-cell pixel logic being communicatively coupled with at least one adjacent pixel in the array; wherein:

a transceiver electronics is configured to operate the array by configuring at least one in-cell pixel logic and to selectably designate at least one pixel as an inner pixel and send a selection signal to the designated inner pixel; and upon the designated inner pixel receiving the selection signal, the cell output interface logic of the designated inner pixel is configured to send a wake-up signal to the cell input interface logic of a second pixel adjacent to the designated inner pixel;

in the first mode, operating the array generates a substantially plane ultrasonic wave having a first acoustic pressure; and in the second mode, operating the array generates, from at least one superpixel region, a focused beam having a second acoustic pressure that is substantially higher than the first acoustic pressure, each superpixel region including at least one inner pixel disposed in a central portion of the superpixel region and at least a first group of outer pixels disposed in an outer portion of the superpixel region.

17. The method of claim 16, wherein the PMUT element is disposed on a substrate, the substrate including thin-film transistor (TFT) circuitry co-fabricated with the PMUT element, the TFT circuitry including the in-cell pixel logic.

18. The method of claim 16, wherein configuring the at least one in-cell pixel logic includes, in the second mode, using a serial interface structure to clock in configuration information to each pixel and associate each pixel with a corresponding superpixel.

19. The method of claim 18, wherein configuring the at least one in-cell pixel logic includes, in the second mode, designating each pixel as a center pixel or an outer pixel of the corresponding superpixel.

20. The method of claim 16, wherein the transceiver electronics includes at least one decoder configured to address and configure the in-cell pixel logic.

21. The method of claim 20, wherein the at least one decoder is configured to selectably designate each pixel as an inner pixel or an outer pixel of a corresponding superpixel.

22. An apparatus comprising:

an array of cells, each cell including a pixel, each pixel including a piezoelectric micromechanical ultrasonic transducer (PMUT) element disposed on a substrate and, disposed within the cell, on the substrate, an in-cell pixel logic, a cell output interface logic and a cell input interface logic, each in-cell pixel logic being communicatively coupled with at least one adjacent pixel in the array; and means for operating the array in a selectable one of a first mode and a second mode by configuring at least one in-cell pixel logic, designating at least one pixel as an inner pixel and sending a selection signal to the designated inner pixel, wherein:

in the first mode, the array generates a substantially plane ultrasonic wave having a first acoustic pressure;

in the second mode, the array generates, from at least one superpixel region, a focused beam having a second acoustic pressure that is substantially higher than the first acoustic pressure, each superpixel region including at least one inner pixel disposed in a central portion of the superpixel region and at least a first group of outer pixels disposed in an outer portion of the superpixel region; and upon the designated inner pixel receiving the selection signal, the cell output interface logic of the designated inner pixel is configured to send a wake-up signal to the cell input interface logic of a second pixel adjacent to the designated inner pixel.

23. The apparatus of claim 22, wherein configuring the at least one in-cell pixel logic includes, in the second mode, using a serial interface structure to clock in configuration information to each pixel and associate each pixel with a corresponding superpixel.

24. The apparatus of claim 23, wherein configuring the at least one in-cell pixel logic includes, in the second mode, designating each pixel as a center pixel or an outer pixel of the corresponding superpixel.

25. The apparatus of claim 22, wherein the in-cell pixel logic includes a 2-bit memory, a 2-bit decoder, and a 2-bit shift register.

26. The apparatus of claim 22, further including at least one decoder configured to address and configure the in-cell pixel logic.

* * * * *